United States Patent [19]

Pfeifer

[11] Patent Number: 4,694,061

[45] Date of Patent: Sep. 15, 1987

[54] RADIATION-SENSITIVE POLYCONDENSATES, PROCESSES FOR THEIR PREPARATION COATED MATERIAL AND ITS USE

[75] Inventor: Josef Pfeifer, Therwil, Switzerland

[73] Assignee: Ciba-Geigy Corporation, Ardsley, N.Y.

[21] Appl. No.: 657,870

[22] Filed: Oct. 4, 1984

[30] Foreign Application Priority Data

Oct. 12, 1983 [CH] Switzerland .................. 5570/83

[51] Int. Cl.[4] .............................................. G03C 1/01
[52] U.S. Cl. ..................................... 528/125; 528/106; 528/112; 528/128; 528/220; 528/226; 528/229
[58] Field of Search ............... 528/125, 106, 112, 128, 528/220, 226, 229

[56] References Cited

U.S. PATENT DOCUMENTS 3,926,639 12/1975 Rosen et al. .................. 528/229
4,629,685 12/1986 Pfeifer ............................ 528/220

Primary Examiner—John Kight
Assistant Examiner—M. L. Moore
Attorney, Agent, or Firm—Luther A. R. Hall

[57] ABSTRACT

Homopolycondensates and copolycondensates of the group comprising linear, saturated polyamides, polyesters, polyamide-imides, polyester-imides and polyester-amides based on benzophenonedicarboxylic acids and benzophenonetricarboxylic acids are radiation-sensitive and are particularly suitable for the production of protective coatings and relief images.

22 Claims, No Drawings

RADIATION-SENSITIVE POLYCONDENSATES, PROCESSES FOR THEIR PREPARATION COATED MATERIAL AND ITS USE

The present invention relates to radiation-sensitive linear saturated homopolycondensates and copolycondensates of the group comprising polyesters, polyamides, polyester-amides, polyester-imides and polyester-amide-imides with benzophenone-di- and/or -tri-carboxylic acid radicals, a material coated with these polycondensates and its use for the production of protective coatings or photogratphic images.

U.S. Pat. No. 3,926,639 discloses that polymers which contain radicals of benzophenonecarboxylic acids are also photopolymerisable or are suitable as photoinitiators for photopolymerisable compounds. Polyesters and polyamides are also mentioned generally. These polyesters and polyamides contain radicals of ethylenically unsaturated carboxylic acids or alcohols as photopolymerisable groups. Furthermore, saturated and cross-linked polyesters obtained from trifunctional and tetrafunctional carboxylic acids and alcohols in a mixture with dicarboxylic acids and diols are described in the examples. These polyesters are soft, tacky materials. Such materials are difficult to handle and their thermo-mechanical properties do not fulfil the requirements imposed on such materials in various fields of application.

The present invention relates to radiation-sensitive linear saturated homopolycondensates and copolycondensates from the group comprising polyesters, polyester-amides, polyamides, polyester-imides and polyamide-imides with benzophenone-di- or -tri-carboxylic acid radicals, with at least one of the recurring structural elements of the formula I and/or II

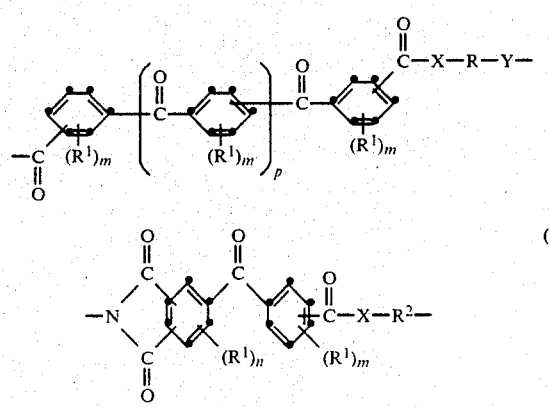

and, in the case of copolycondensates, also recurring structural elements of the formula III and/or IV

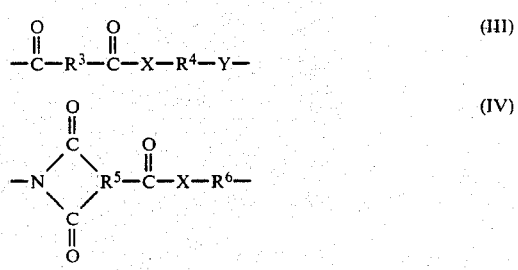

in which the imide group in structural element II is bonded to two adjacent C atoms, m is 0 or a number from 1 to 4, p is a number from 1 to 5 or 0 and n is 0 or a number from 1 to 3, X is $-S-$, $-O-$ or $-NR^7-$ and Y independently has the same meaning as X, $R^1$ is alkyl or alkoxy having less than 6 C atoms, aryl having 6 to 10 C atoms, aralkyl having 7 to 10 C atoms or halogen, R is an unsubstituted or substituted divalent aliphatic, cycloaliphatic, araliphatic or aromatic radical and, if X and Y are the group $-NR^7-$, R and one of the radicals $R^7$ together are alkylene having 5 to 7 C atoms, to which the second $-NR^7-$ group is bonded, or R is methylene, ethylene or propylene and the two radicals $R^7$ of the $NR^7$ groups together are ethylene or propylene, or, if X or Y is $-O-$ or $-S-$ and the other is $-NR^7-$, R and $R^7$ together are alkylene having 5–7 C atoms, $R^2$ is an unsubstituted or substituted divalent aliphatic or aromatic hydrocarbon radical or, if X is the $-NR^7-$ group, $R^2$ and $R^7$ together are alkylene having 5 to 7 C atoms, $R^4$ independently has the same meaning as R and $R^6$ independently has the same meaning as $R^2$, $R^3$ is a divalent saturated aliphatic or aromatic radical, $R^5$ is a trivalent saturated aliphatic or aromatic radical in which the imide group is bonded to two adjacent C atoms and $R^7$ is a hydrogen atom, alkyl, cycloalkyl, aryl, aralkyl or alkaralkyl, the copolycondensates containing at least 10 mol %, based on the copolycondensate, of structural elements of the formula I and/or II.

In formulae I and III, X and Y preferably have the same meaning, and X and Y in formulae I–IV advantageously are a $-NR^7-$ group or $-O-$. X and Y particularly preferably represent either $-O-$ or the $NR^7$ group in formulae I and III. In formulae II and IV, X is preferably the $NR^7$ group.

The amount of structural elements of the formulae I and/or II in the polycondensates is preferably at least 50 mol %, in particular at least 70 mol % and especially at least 90 mol %. The amount essentially depends on the desired radiation-sensitivity of the polycondensates.

In formulae I and II, p, m and n are preferably 1 or, in particular, 0. $R^1$ is preferably alkyl or alkoxy having 1 to 4 C atoms, in particular methyl, ethyl or methoxy, or halogen, in particular Br or Cl.

A linear or branched alkyl radical $R^7$ preferably contains 1 to 6 C atoms, and a cycloalkyl radical $R^7$ preferably contains 5 to 7 ring carbon atoms and can be cyclopentyl, cyclohexyl or methylcyclohexyl. An aryl radical $R^7$ is, in particular, a phenyl radical, for example phenyl, methylphenyl or benzyl. $R^7$ is particularly preferably a hydrogen atom.

The carbonyl groups in the structural elements of the formulae I and II are preferably bonded in the meta-position or, in particular, in the para-position relative to the carbonyl bridge group, and the imide group in formula II is preferably bonded in the ortho-/meta-position or, in particular, the meta-/para-position relative to the carbonyl bridge group.

A divalent aliphatic radical R, $R^2$, $R^4$ or $R^6$ in formulae I to IV preferably contains 2 to 30 C atoms. The radical particularly contains 6 to 30, and especially 6 to 20, C atoms if X and Y are the $NR^7$ group. If X and Y in formulae I and III are $-S-$ or $-O-$, or X in formulae II and IV is $-O-$, $-S-$ or the $-NR^7-$ group, the aliphatic radical preferably contains 2 to 20, and in particular 2 to 12, C atoms. In a preferred sub-group, R, $R^2$, $R^4$ and $R^6$ are linear or branched alkylene, which can be interrupted by oxygen atoms, NH, $NR^a$, $+NR_2^aG-$, cyclopentylene, cyclohexylene, naphthylene phenylene or hydantoin radicals. $R^a$ can be, for example, alkyl having 1 to 12 C atoms or cycloalkyl having 5 or 6 ring C atoms, phenyl or benzyl. $G^-$ is an anion of a proton acid, for example halide, sulfate or phosphate. In another preferred embodiment, R, $R^2$, $R^4$ and $R^6$ are linear or branched alkylene, $-(CH_2)_x-R^8-(CH_2)_y-$, in which $R^8$ is phenylene, naphthylene, cyclopentylene or cyclohexylene and x and y independently of one another are the number 1, 2 or 3, $-R^9-(OR^{10})_p-O-R^9-$, in which $R^9$ is ethylene, 1,2-propylene, 1,3-propylene or 2-methyl-1,3-propylene and $R^{10}$ is ethylene, 1,2-propylene, 1,2-butylene, 1,3-propylene or 1,4-butylene and p is a number from 1 to 100, or

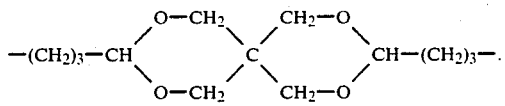

Examples of aliphatic radicals are: ethylene, 1,2- or 1,3-propylene, 2,2-dimethyl-1,3-propylene, 1,2-, 1,3- or 1,4-butylene, 1,3- or 1,5-pentylene, the hexylenes, heptylenes, octylenes, decylenes, dodecylenes, tetradecylenes, hexadecylenes, octadecylenes and eicosylenes, 2,4,4-trimethylhexylene, 1,10-dialkyldecylene, in which the alkyl radical preferably has 1 to 6 C atoms, the substituted 1,11-undecylenes, such as those described, for example, in European Pat. No. B-0,011,559, divalent radicals of jeffamines, for example

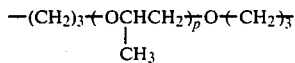

where p=1 to 100 or

where p=1-100, dimethylenecyclohexane, xylylene and diethylenebenzene. R, $R^2$, $R^4$ and $R^6$ are particularly preferably longer-chain, branched alkylene having, for example, 8 to 30 C atoms, if X and Y in formulae I to IV are $-NR^7-$ groups.

If X and Y in formulae I to IV, in particular in formulae I and III, are $-O-$ or $-S-$, R, $R^2$, $R^4$ and $R^6$, or R and $R^4$, are preferably linear alkyl having 2 to 12, in particular 2 to 6, C atoms.

The aliphatic radicals interrupted by heterocyclic radicals can be, for example, those which are derived from N,N'-aminoalkylated or N,N'-hydroxyalkylated hydantoins or benzimidazoles. Examples are N,N'-($\gamma$-aminopropyl)-5,5-dimethyl-hydantoin or -benzimidazolone, and those of the formula

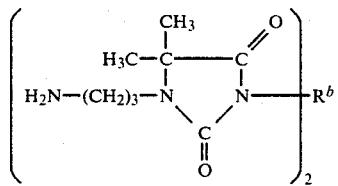

in which $R^b$ is alkylene having 1 to 12, preferably 1 to 4, C atoms or

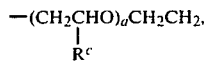

in which $R^c$ is a hydrogen atom or methyl and a is an integer from 1 to 20.

Examples of corresponding diols are N,N'-($\beta$-hydroxyethyl)-5,5-dimethylhydantoin, N,N'-($\beta$-hydroxyethyl)benzimidazolone and N,N'-$\beta$-hydroxyethyl)-4,5,6,7-tetrabromobenzimidazolone.

Examples of suitable substituents for the aliphatic radicals are halogens, such as F or Cl, and alkyl or alkoxy having 1 to 6 C atoms.

A divalent cycloaliphatic radical R, $R^2$, $R^4$ or $R^6$ in formulae I to IV preferably contains 5 to 8 ring C atoms and is, in particular, mononuclear or dinuclear cycloalkylene which has 5 to 7 ring C atoms and is unsubstituted or substituted by alkyl, which preferably contains 1 to 4 C atoms. In a preferred embodiment, a cycloaliphatic radical R, $R^2$, $R^4$ or $R^6$ is a radical of the formula

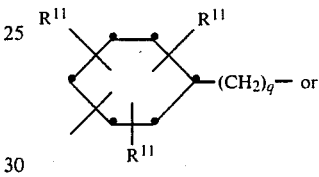

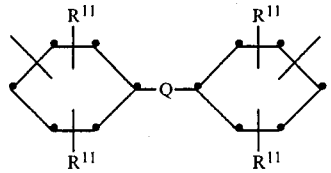

in which q is 0 or 1, the radicals $R^{11}$ independently are hydrogen or alkyl having 1 to 6 C atoms and Q is a direct bond, O, S, $SO_2$, alkylene having 1 to 3 C atoms or alkylidene having 2 to 6 C atoms. $R^{11}$ is preferably ethyl or methyl, Q is preferably methylene and the alkylidene preferably contains 2 or 3 C atoms, such as ethylidene or 1,1- or 2,2-propylidene.

A cycloalkylene radical R, $R^2$, $R^4$ and $R^6$ is, for example: 1,2- or 1,3-cyclopentylene, 1,2-, 1,3- or 1,4-cyclohexylene, cycloheptylene, cyclooctylene, methylcyclopentylene, methyl- or dimethyl-cyclohexylene, 3- or 4-methylcyclohex-1-yl, 5-methyl-3-methylenecyclohex-1-yl, 3,3'- or 4,4'-bis-cyclohexylene, 3,3'-dimethyl-4,4'-biscyclohexylene, 4,4'-bis-cyclohexylene-ether, -sulfone, -methane or 2,2-propane, and the divalent radicals of bis-aminomethyltricyclodecane, bis-aminomethylnorbornane and menthanediamine. Particularly preferred divalent cycloaliphatic radicals are 1,4- or 1,3-cyclohexylene, methylenebis(cyclohex-4-yl) and methylenebis-(3-methylcyclohex-4-yl).

An araliphatic radical R, $R^2$, $R^4$ or $R^6$ preferably contains 7 to 30 C atoms. If the aromatic group of the araliphatic radical is bonded to N atoms in the radical of the formula I to IV, which is the preferred case, these aromatic groups are preferably substituted in the same way as an aromatic radical R, $R^2$, $R^4$ or $R^6$, the preferences being included. The araliphatic radical preferably contains 7 to 26, in particular 8 to 22, C atoms. The aromatic radical in the araliphatic radical is preferably a phenyl radical. An araliphatic radical R, $R^2$, $R^4$ or $R^6$ is, in particular, aralkylene which is unsubstituted or substituted on the aryl by alkyl, the alkylene radical being linear or branched. In a preferred embodiment, the araliphatic radical has the formula

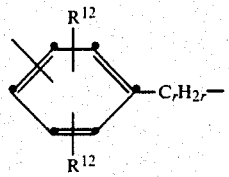

in which the radicals $R^{12}$ independently of one another are hydrogen atoms or, in particular, alkyl having 1–6 C atoms and R is an integer from 1 to 20. The free bond can be in the o-position, m-position or, in particular, p-position relative to the $C_rH_{2r}$ group, and one or both of the radicals $R^{12}$ are preferably bonded in the o-position relative to the free bond. If X and Y are —O— or —S—, the araliphatic radical is preferably substituted.

Examples of a divalent araliphatic radical R, $R^2$, $R^4$ or $R^6$ are: m- or p-benzylene, 3-methyl-p-benzylene, 3-ethyl-p-benzylene, 3,5-dimethyl-p-benzylene, 3,5-diethyl-p-benzylene, 3-methyl-5-ethyl-p-benzylene, p-phenylenepropylene, 3-methyl-p-phenylene-propylene, p-phenylenebutylene, 3-ethyl-p-phenylenepentylene and, in particular, longer-chain phenylenealkylene radicals of diamines, which are described, for example, in European Pat. No. A-0,069,062: 6-(p-phenylene)-6-methylhept-2-yl, 6-(3'-methyl-p-phenylene)-6-methylhept-2-yl, 6-(3'-ethyl-p-phenylene)-6-methylhept-2-yl, 6-(3',5'-dimethyl-p-phenylene)-6-methylhept-2-yl, 11-(p-phenylene)-2,11-dimethyl-dodec-1-yl and 13-(p-phenylene)-2,12-dimethyltetradec-3-yl.

Particularly preferred homopolycondensates and copolycondensates are those with structural elements of the formulae I to IV in which R, $R^2$, $R^4$ and $R^6$ are unsubstituted in particular, substituted aromatic radicals and X and Y are the —$NR^7$— group. The substituent on the aromatic radical preferably contains 1 to 20, in particular 1–12 and especially 1–6, C atoms. In particular, the substituent is linear or branched alkyl, alkoxy or alkoxyalkyl having 1 to 6 C atoms, benzyl, trimethylene or tetramethylene. Alkoxy methyl is the preferred alkoxyalkyl radical, and methoxy is the preferrd alkoxy radical. Examples of the substituents are: methyl, ethyl, propyl, isopropyl, n-butyl, isobutyl, pentyl, hexyl, octyl, dodecyl, tetradecyl, eicosyl, methoxy, ethoxy, propoxy, butoxy, pentoxy, hexoxy, methoxymethyl, methoxyethyl, ethoxymethyl, propoxymethyl, butoxymethyl, benzyl, methylbenzyl and phenethyl. Preferred radicals are methoxymethyl, ethoxymethyl, methyl, ethyl, trimethylene and tetramethylene. Methyl and ethyl are particularly preferred. The aromatic radical can be a mononuclear or polynuclear, in particular dinuclear, radical. Mononuclear radicals can contain 1 to 4, preferably 2 to 4 and especially 4, substituents, and dinuclear radicals can contain 1 to 4, preferably 2, substituents in each nucleus. It has been found that the photosensitivity of the homopolycondensates or copolycondensates is particularly high if one or, in particular, two substituents are bonded in the ortho-position relative to the X and/or Y group, and X and Y are —$NR^7$—. Such polycondensates also have particularly good thermomechanical properties. Substitution in one or both of the ortho-positions is thus preferred in this case. The aromatic radical is preferably bonded in the meta- or para-position relative to the X and/or Y group. If X and Y are —O— or —S—, unsubstituted dinuclear aromatic radicals are preferred.

An aromatic radical R or R' can contain 6 to 30, in particular 6 to 20, C atoms. The aromatic radical is preferably a hydrocarbon radical, in particular a mononuclear or dinuclear phenylene radical, a naphthylene radical or a pyridine radical, which is substituted by alkyl, alkoxyalkyl, alkoxy, trimethylene or tetramethylene.

A preferred sub-group is formed by those aromatic radicals of the formulae

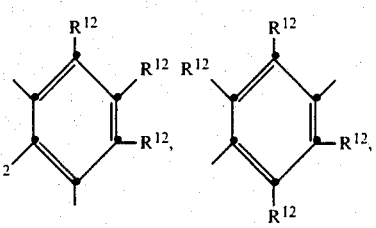

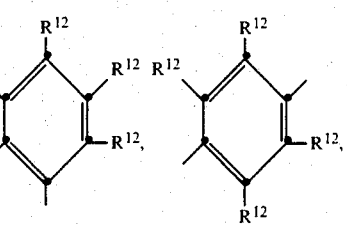

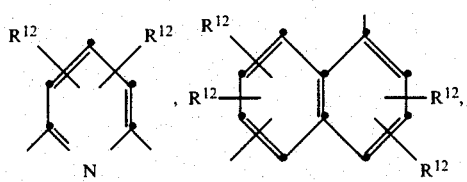

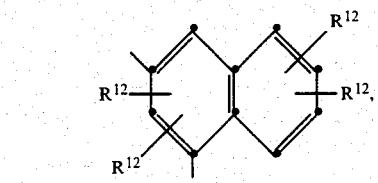

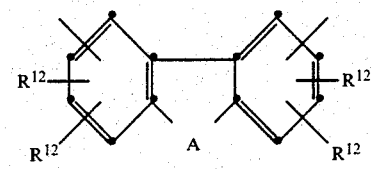

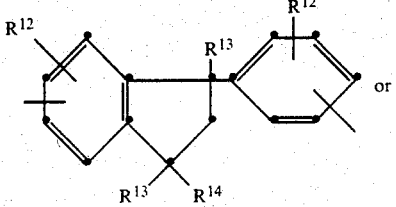

or

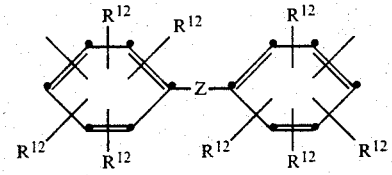

in which all the radicals $R^{12}$ are hydrogen atoms or, in the case of monosubstitution, one radical $R^{12}$ is alkyl having 1 to 6 C atoms and the other radicals $R^{12}$ are hydrogen atoms, or, in the case of di-, tri- or tetra-substitution, two of the radicals $R^{12}$ are alkyl having 1 to 6 C atoms and the other radicals $R^{12}$ are hydrogen atoms or alkyl having 1 to 6 C atoms, or, in the case of di-, tri- or tetra-substitution, two vicinal radicals $R^{12}$ in the phenyl ring are trimethylene or tetramethylene and the other radicals $R^{12}$ are hydrogen atoms or alkyl having 1 to 6 C atoms, A is O, S, NH, CO or $CH_2$, $R^{13}$ is a hydrogen atom or alkyl having 1 to 5 C atoms and $R^{14}$ is alkyl having in each case 1 to 5 C atoms, and Z is a direct bond, O, S, SO, $SO_2$, CO, $$\overset{O}{\underset{CO.}{\parallel}}\overset{O}{\underset{CNR^{15}}{\parallel}},$$

$NR^{15}$, CONH, NH, $R^{15}SiR^{16}$, $R^{15}OSiOR^{16}$, alkylene having 1 to 6 C atoms, alkenylene or alkylidene having 2 to 6 C atoms, phenylene or phenyldioxyl, in which $R^{15}$ and $R^{16}$ independently of one another are alkyl having 1 to 6 C atoms or phenyl. $R^{13}$ and $R^{14}$ are preferably methyl, A is preferably —$CH_2$— or —O— and Z is preferably a direct bond, —O—, —$CH_2$— or alkylidene having 2 to 4 C atoms. $R^{15}$ and $R^{16}$ are preferably methyl, ethyl or phenyl. The alkylene radical preferably contains 2 to 4 C atoms and is, in particular, ethylene. Alkenylene is, in particular, ethenylene.

A preferred sub-group are toluylene radicals and radicals of o,o'-substituted diaminodiphenylenes, diaminodiphenylmethanes and diaminodiphenyl ethers.

A particularly preferred group is formed by those aromatic radicals of the formulae

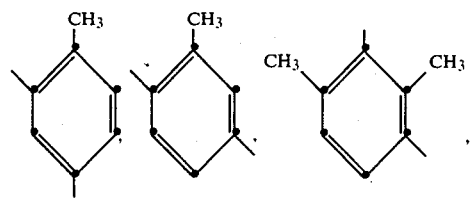

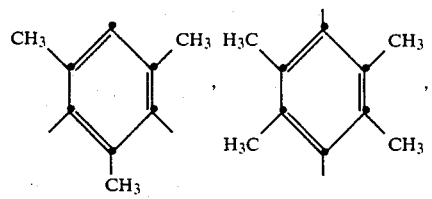

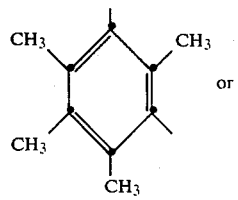

or

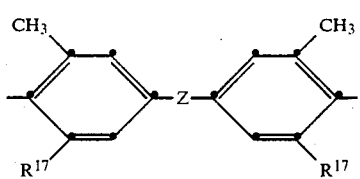

in which Z is a direct bond, O or, in particular, $CH_2$ and $R^{17}$ is a hydrogen atom or, in particular, methyl or ethyl.

Examples of unsubstituted and substituted aromatic radicals are 1,3- or 1,4-phenylene, 2,4- or 2,7-naphthylene, 4,4'-diphenylene, 4,4'-diphenylenemethane, 4,4'-diphenylene ether, 4-methyl-1,3-phenylene, 4-ethyl-1,3-phenylene, 2-methyl-1,3-phenylene, 4-benzyl-1,3-phenylene, 4-methoxymethyl-1,3-phenylene, tetrahydro-1,3- or -1,4-naphthylene, 3-propyl-1,3- or -1,4-phenylene, 3-isopropyl-1,4-phenylene, 3,5-dimethyl-1,4-phenylene, 2,4-dimethyl-1,3-phenylene, 2,3-dimethyl-1,4-phenylene, 5-methyl-1,3-phenylene, 2,3,5,6-tetramethyl-1,4- or -1,3-phenylene, 3-methyl-2,6-pyridylene, 3,5-dimethyl-2,6-pyridylene, 3-ethyl-2,6-pyridylene, 1-methyl-2,7-naphthylene, 1,6-dimethyl-2,7-naphthylene, 1-methyl-2,4-naphthylene, 1,3-dimethyl-2,4-naphthylene, the divalent radicals of 5-amino-1-(3'-amino-4'-methylphenyl)-1,3,3-trimethylindane or 6-amino-5-methyl-1-(3'-amino-4'-methyl)-1,3,3-trimethylindane, 4-methoxymethyl-1,3-phenylene, 3-methyl-p-diphenylene, 3-ethyl-p-diphenylene, 3,3'-dimethyl-p-diphenylene, 3,3'-diethyl-p-diphenylene, 3-methyl-3'-ethyl-p-diphenylene, 3,3',5,5'-tetramethyl-diphenylene, 3,3'-methyl-5,5'ethyl-p-diphenylene, 4,4'-dimethyl-m-diphenylene, 3,3'-diisopropyldiphenylene and radicals of the formulae

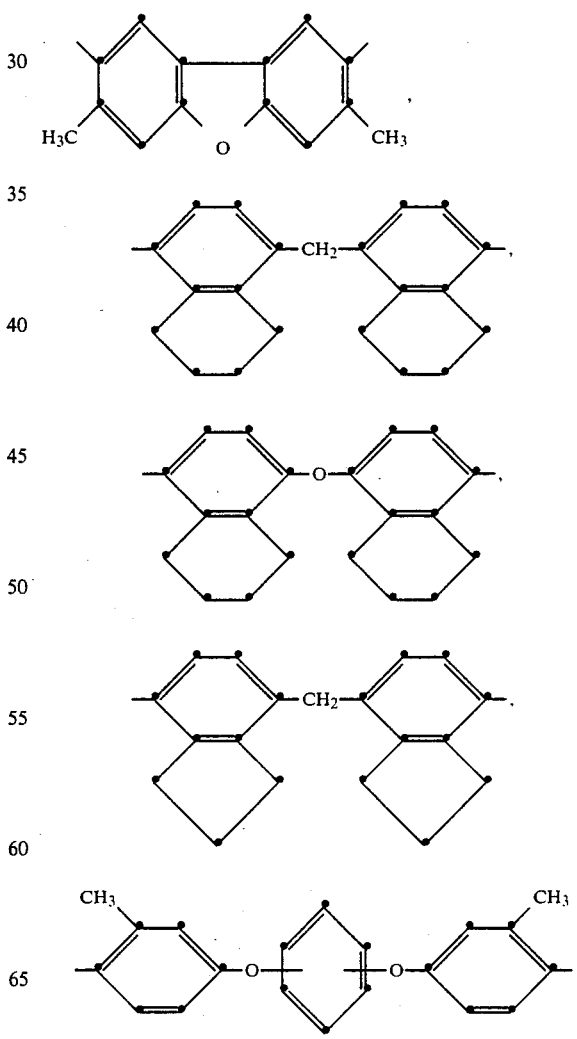

-continued

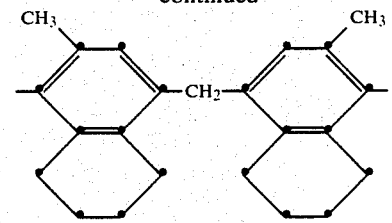

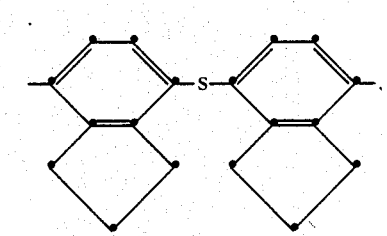

as well as

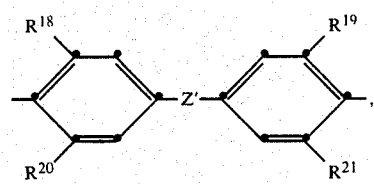

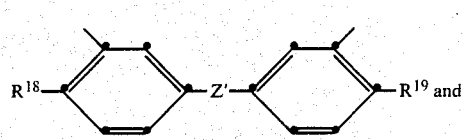

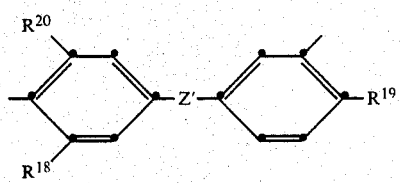

in which Z', $R^{18}$, $R^{19}$, $R^{20}$ and $R^{21}$ are as defined in the following table:

| Z' | $R^{18}$ | $R^{19}$ | $R^{20}$ | $R^{21}$ |
|---|---|---|---|---|
| $CH_2$ | Methyl | Methyl | — | — |
| $CH_2$ | Methyl | Ethyl | — | — |
| $CH_2$ | Ethyl | Ethyl | — | — |
| $CH_2$ | Isopropyl | Isopropyl | — | — |
| $CH_2$ | Methoxymethyl | | — | — |
| $CH_2$ | Benzyl | Benzyl | — | — |
| $CH_2$ | Methyl | Methyl | H | H |
| $CH_2$ | Ethyl | Ethyl | H | H |
| $CH_2$ | Isopropyl | Isopropyl | H | H |
| $CH_2$ | Methoxymethyl | | H | H |
| $CH_2$ | Methyl | Ethyl | H | H |
| $CH_2$ | Methoxymethyl | | Methoxymethyl | |
| $CH_2$ | Methyl | Methyl | Methyl | Methyl |
| $CH_2$ | Ethyl | Ethyl | Ethyl | Ethyl |
| $CH_2$ | Methyl | Methyl | Ethyl | Ethyl |
| $CH_2$ | Ethyl | Ethyl | Isopropyl | Isopropyl |
| $CH_2$ | Isopropyl | Isopropyl | Isopropyl | Isopropyl |
| $CH_2$ | Isopropyl | Isopropyl | H | H |
| $CH_2$ | Methoxy | Methoxy | H | H |
| O | Methyl | Methyl | — | — |
| O | Ethyl | Ethyl | — | — |
| O | Methyl | Methyl | H | H |
| O | Methyl | Methyl | Methyl | Methyl |
| O | Methyl | Methyl | Ethyl | Ethyl |
| S | Methyl | Methyl | — | — |
| S | Ethyl | Ethyl | — | — |
| S | Methyl | Methyl | H | H |
| S | Methyl | Methyl | Methyl | Methyl |
| S | Ethyl | Ethyl | Ethyl | Ethyl |
| S | Methyl | Methyl | Ethyl | Ethyl |
| CO | Methyl | Methyl | — | — |
| CO | Methyl | Methyl | H | H |
| CO | Methyl | Methyl | Methyl | Methyl |
| $SO_2$ | Methyl | Methyl | — | — |
| $SO_2$ | Methyl | Methyl | H | H |
| $SO_2$ | Methyl | Methyl | Methyl | Methyl |
| $SO_2$ | Ethyl | Ethyl | Methyl | Methyl |
| SO | Methyl | Methyl | — | — |
| SO | Methyl | Methyl | H | H |
| COO | Methyl | Methyl | H | H |
| COO | Methyl | Methyl | Methyl | Methyl |
| $CONCH_3$ | Methyl | Methyl | H | H |
| $NCH_3$ | Methyl | Methyl | — | — |
| $NCH_3$ | Methyl | Methyl | Methyl | Methyl |
| CONH | Methyl | Methyl | — | — |
| NH | Ethyl | Ethyl | H | H |
| NH | Methyl | Methyl | — | — |
| $Si(Methyl)_2$ | Methyl | Methyl | — | — |
| $Si(Phenyl)_2$ | Methyl | Methyl | Methyl | Methyl |
| $Si(OMethyl)_2$ | Ethyl | Ethyl | — | — |
| $Si(OPhenyl)_2$ | Methyl | Methyl | H | H |
| Ethylene | Methyl | Methyl | — | — |
| Ethylene | Methyl | Methyl | Methyl | Methyl |
| Ethylene | Ethyl | Ethyl | H | H |
| Ethylene | Methyl | Methyl | — | — |
| Phenylene | H | H | Methyl | Methyl |
| Phenylene | Alkyl | Alkyl | — | — |
| $(CH_3)_2C$ | Methyl | Methyl | H | H |
| $(CH_3)_2C$ | Methyl | Methyl | Methyl | Methyl |

If X and Y in formulae I and III are the $NR^7$ group, or X or Y is —O— or —S— and the other is the $NR^7$ group, or X in formulae II and IV is an oxygen atom, R and one of the radicals $R^7$, or $R^2$ and $R^7$ together can be alkylene having 5-7 C atoms, to which the second —$NR^7$— group or —O— or —S— is bonded, or R and $R^2$ are methylene, ethylene or propylene and the two radicals $R^7$ of the $NR^7$ groups together are ethylene or propylene. The radicals thus defined are derived from heterocyclic diamines or amino-alcohols or -thiols. Examples of these are: 3-aminopyrrolidine, 3-hydroxypyrrolidine, imidazolidine, 3- or 4-aminopiperidine, 3- or 4-hydroxypiperidine and piperazine.

A preferred group of polycondensates are those in which X and Y in formulae I to IV are the —$NR^7$— group and R, $R^2$, $R^4$ and $R^6$ are radicals of the formulae

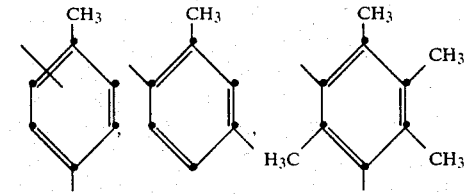

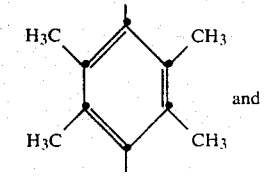

and

-continued

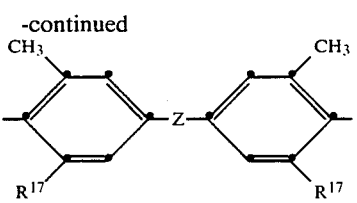

in which Z is a direct bond, —O— or, particular, —CH₂— and R¹⁷ is ethyl or, in particular, methyl, or branched alkylene having 6 to 20 C atoms, which is branched, in particular, in the α-position relative to the —NR⁷— group.

If X and Y in formulae I and III are oxygen atoms, in a preferred embodiment R or R⁴ is branched or, in particular, linear alkylene having 2 to 20, in particular 2 to 12, C atoms, the divalent radical of a polyoxyalkylene having 2-100 oxaalkylene units, for example —(OCH₂CH₂O)$_u$,

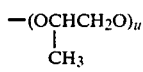

or —(OCH₂CH₂CH₂O)$_u$, where u=2 to 100, cyclohexylene,

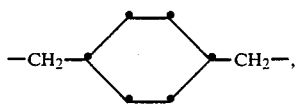

benzylene or a mononuclear or dinuclear phenylene radical of the formula

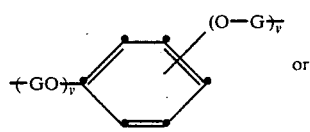

or

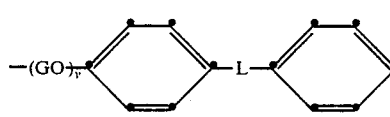

in which y is 0 or 1, L is a direct bond, —O—, —S—, —SO—, —SO₂—, CO, methylene, ethylidene, 1,1- or 2,2-propylidene, butylidene or cyclohexylidene and G is ethylene, 1,2-propylene or 2-hydroxy-1,3-propylene.

The phenylene radicals can be substituted by alkyl or alkoxy having 1 to 4 C atoms or halogen, in particular Cl and Br.

R³ is the divalent radical of a saturated organic dicarboxylic acid. The aliphatic radical can contain 2 to 40, preferably 2 to 20, C atoms, and in particular 2-12 C atoms. R³ can be, for example, a cycloaliphatic radical having 5 to 7 ring carbon atoms or linear or branched alkylene having 2 to 12 C atoms. An aromatic radical R³ preferably contains 6-18 C atoms and is preferably an aromatic hydrocarbon radical.

Aliphatic dicarboxylic acids are those having 2 to 40 C atoms, for example oxalic acid, malonic acid, dimethylmalonic acid, succinic acid, pimelic acid, adipic acid, trimethyladipic acid, sebacic acid, azelaic acid and hydrogenated dimeric acids (dimerisation products of unsaturated aliphatic carboxylic acids such as oleic acid), and alkylated malonic and succinic acids, such as octadecylsuccinic acid.

Cycloaliphatic dicarboxylic acids are: 1,3-cyclobutanedicarboxylic acid, 1,3-cyclopentanedicarboxylic acid, 1,3- and 1,4-cyclohexanedicarboxylic acid, 1,3- and 1,4-(dicarboxymethyl)-cyclohexane and 4,4'-dicyclohexyldicarboxylic acid.

Suitable aromatic dicarboxylic acids are: terephthalic acid, isophthalic acid, o-phthalic acid, 1,3-, 1,4-, 2,6- or 2,7-naphthalenedicarboxylic acid, 4,4'-diphenyldicarboxylic acid, 4,4'-diphenyl sulfone-carboxylic acid, 1,1,3-trimethyl-5-carboxy-3-(p-carboxyphenyl)-indane, 4,4'-diphenyl ether-dicarboxylic acid, bis-p-(carboxyphenyl)-methane and tetrabromoterephthalic acid.

Aromatic and cycloaliphatic orthodicarboxylic acids and glutaric acids and succinic acids are less suitable for polyamides, since they tend to form imides under the influence of primary amines. The aromatic dicarboxylic acids are preferred, and of these terephthalic acid and isophthalic acid are particularly preferred.

R⁵ is the trivalent radical of a saturated aliphatic or aromatic tricarboxylic acid in which two carboxyl groups are bonded to two adjacent C atoms. The trivalent radical can contain 2 to 16 C atoms. R⁵ is preferably an aromatic radical. Examples of tricarboxylic acids with an aliphatic radical are ethylenetricarboxylic acid and 1,3,4-tricarboxycyclohexane. Examples of aromatic radicals are, in particular, trimellitic acid as well as 2,6,7-naphthalenetricarboxylic acid, 3,4,4'-diphenyltricarboxylic acid, 3',3,4-diphenyloxide-tricarboxylic acid, 3,4,4'-diphenylmethanetricarboxylic acid and 3,4,4'-diphenyl sulfone-tricarboxylic acid.

In a particularly preferred embodiment, the polycondensates contain structural elements of the formula

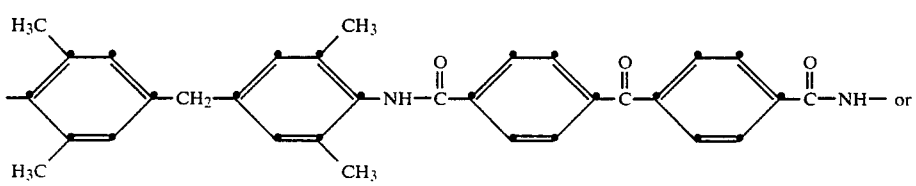

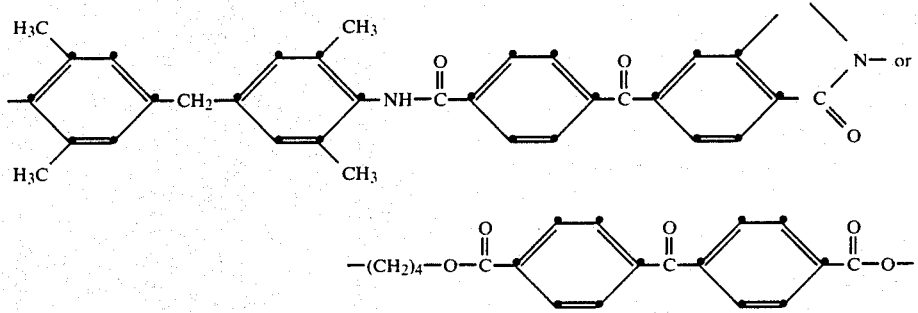

The polycondensates according to the invention can have average molecular weights (weight-average $\overline{M}w$) of at least 2,000, preferably at least 5,000. The upper limit essentially depends on the desired properties, for example their processability or solubility. It can be up to 500,000, preferably up to 100,000 and in particular up to 50,000. The polycondensates can furthermore be random polymers or block polymers. They are prepared by customary processes in equipment provided for this purpose. The polymers are preferably linear in structure, but can be branched to a low degree with at least trifunctional monomers, such as triamines, triols or tetrols, which are added in small amounts.

The invention furthermore relates to a process for the preparation of the homopolycondensates and copolycondensates according to the invention, which comprises polycondensing a benzophenonedicarboxylic acid of the formula V

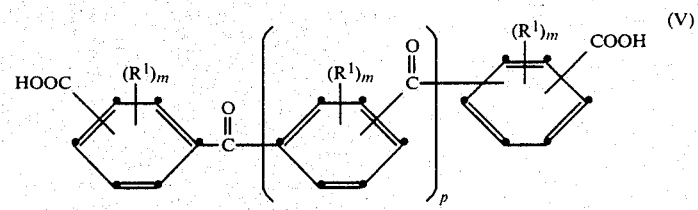

or a benzophenonetricarboxylic acid of the formula VI

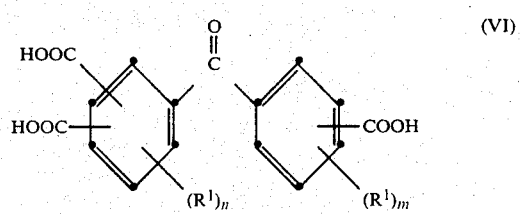

or a mixture of these acids in an amount of at least 10 mol %, based on the polycondensates, if appropriate together with a dicarboxylic acid of the formula VII and/or a tricarboxylic acid of the formula VIII

or their polyester- or polyamide-forming derivatives with a diol, dimercaptan, diamine, amino-alcohol, aminomercaptan or hydroxymercaptan of the formula IX or a mixture of these monomers $$HX—R—YH \qquad (IX)$$

in which m, n, $R^1$, $R^3$, $R^5$ and $R^7$ are as defined and X and Y either are —O—, —S— or —$NR^7$—, or X is —O— or —S— and Y is —$NR^7$—.

The reactants of the formulae V to IX are known, or they can be prepared by known processes. Examples of suitable polyamide- or polyester-forming derivatives are acid anhydrides, acid amides, acid halides and acid esters. Examples of suitable preparation processes are solvent polycondensation, melt condensation and phase boundary polycondensation. Suitable solvents are mentioned below. Homopolycondensates and copolycondensates with imide groups can be prepared in 2 stages by first preparing intermediates of these polycondensates with amide groups and converting the amide groups into imide groups in a second stage, which can be carried out by means of heat or in the presence of water-binding agents, such as carboxylic acid anhydrides.

The reaction temperatures essentially depend on the starting materials or their reactivity. They can be −50° to 350° C., preferably 50° to 300° C. The polycondensation can furthermore be carried out under normal pressure or reduced pressure. The water, alcohol or amine formed during the condensation is advantageously removed from the reaction mixture during the process, or hydrogen halides formed, for example HCl or HBr, are bonded by addition of suitable agents, such as tertiary amines or epoxides.

Polyesters are likewise advantageously prepared in two stages by carrying out an esterification or transesterification with the diol or dimercaptan in a first stage and then continuing the polycondensation, preferably in the melt, with removal of the excess diol or mercaptan formed, until the desired viscosity is reached.

The polycondensates according to the invention are polymers which can be crosslinked directly by the action of radiation. They are suitable for the production of shaped articles, films and fibres and for coating substrates, for protection of surfaces or for the production of relief images, it being possible for the properties of the polycondensates to be modified by irradiation. Some of the polycondensates according to the invention are thermoplastics which can be processed by the methods customary for this class of polymer. The high-melting polycondensates, in particular the completely aromatic polycondensates, are preferably processed from solution.

A preferred field of application is the use for coating surfaces and the production of relief images on such coated substrates, to which the present invention furthermore relates. It is particularly advantageous that, in order to achieve the desired properties, the polycondensates according to the invention can be appropriately modified for particular requirements imposed during use by choosing different monomers and/or by mixing various polycondensates.

To produce the coated material according to the invention, a polycondensate or mixtures thereof are advantageously dissolved in a suitable organic solvent, if necessary with warming. Examples of suitable solvents are polar aprotic solvents, which can be used by themselves or in mixtures of at least two solvents. Examples are: ethers, such as dibutyl ether, tetrahydrofuran, dioxane, ethylene glycol, dimethyl-ethylene glycol, dimethyl-diethylene glycol, diethyl-diethylene glycol and dimethyl-triethylene glycol, halogenated hydrocarbons, such as methylene chloride, chloroform, 1,2-dichloroethane, 1,1,1-trichloroethane and 1,1,2,2-tetrachloroethane, carboxylic acid esters and lactones, such as ethyl acetate, methyl propionate, ethyl benzoate, 2-methoxyethyl acetate, γ-butyrolactone, o-valerolactone and pivalolactone, carboxylic acid amides and lactams, such as formamide, acetamide, N-methylformamide, N,N-dimethylformamide, N,N-diethylformamide, N,N-dimethylacetamide, N,N-diethylacetamide, γ-butyrolactam, Σ-caprolactam, N-methylpyrrolidone, N-acetylpyrrolidone, N-methylcaprolactam, tetramethylurea and hexamethylphosphoric acid triamide, sulfoxides, such as dimethylsulfoxide, sulfones, such as dimethyl sulfone, diethyl sulfone, trimethylene sulfone and tetramethylene sulfone, trimethylamine, triethylamine, N-methylpyrrolidine, N-methylpiperidine, N-methylmorpholine and substituted benzenes, such as chlorobenzene, nitrobenzene, phenols or cresol.

Undissolved portions can be removed by filtration, preferably by pressure filtration. The concentration of polymer in the coating agent thus obtained is preferably not more than 50% by weight, in particular not more than 30% by weight and especially not more than 20% by weight, based on the solution. The solutions are stable on storage.

Other customary additives which do not adversely affect the photosensitivity can be incorporated during the preparation of the solutions. Examples of these are delustering agents, flow control agents, fine-particled fillers, flameproofing agents, fluorescent brighteners, antioxidants, light stabilisers, stabilisers, dyes, pigments and adhesion promoters. Furthermore, if desired, sensitisers, for example thioxanthone derivatives or benzophenone derivatives, can also additionally be incorporated in order to increase the photosensitivity still further.

The coating agents can be applied to suitable substrates or carriers by customary methods, such as immersion, brushing and spraying methods and whirler, cascade and curtain coating. Examples of suitable substrates are plastics, metals and metal alloys, semi-metals, semi-conductors, glass, ceramics and other inorganic materials, for example $SiO_2$ and $Si_3N_4$. Thereafter, the solvent is removed, if necessary by warming and if necessary in vacuo. Non-tacky, dry, uniform films are obtained. Depending on the application, the films applied can have coating thicknesses of up to about 500 μm or more, preferably of 0.5 to 500 μm and in particular 1 to 50 μm.

The radiation-sensitive layer in the material according to the invention can be crosslinked by the action of radiation.

Photostructuring or photocrosslinking can be effected by high-energy radiation, for example by light, in particular in the UV range, by X-rays, laser light, electron beams and the like. The material according to the invention is outstandingly suitable for producing protective films and passivating varnishes, and as a photographic recording material for heat-stable relief images.

The invention furthermore relates to this use. Examples of fields of application are protective, insulating and passivating varnishes in electrical engineering and electronics, photomasks for electronics, textile printing and the graphical industry, etch resists for the production of printed circuits and printing plates and integrated switching circuits, relays for the production of X-ray masks, solder-stopping varnishes, dielectrics for multilayer circuits and structural elements for liquid crystal displays.

Protective films are produced by direct exposure, the exposure times essentially depending on the coating thicknesses and the photosensitivity.

Photographic production of the relief structure is effected by imagewise exposure through a photomask, subsequent development, with removal of the non-exposed portions, with a solvent or a solvent mixture, after which the image produced can be stabilised, if appropriate, by after-treatment with heat.

The invention furthermore relates to such a process for the application of relief structures. The abovementioned solvents are examples of suitable developers.

The polymer layer of the material according to the invention has a photosensitivity which is sufficient for many application purposes and in some cases is high, and it can be photocrosslinked directly. The protective films and relief images have good adhesion and heat, mechanical and chemical stability. Only minor shrinkage is observed during after-treatment with heat. Furthermore, additives for producing or increasing photosensitivity can be avoided. The material is stable on storage but should be protected from the action of light.

The following examples illustrate the invention in more detail.

EXAMPLE 1

4.2417 g of a technical grade diamine mixture consisting of 3,3'-diethyl-4,4'-diaminodiphenylmethane, 3-ethyl-4,4'-diaminodiphenylmethane and 4,4'-diaminodiphenylmethane with an equivalent weight of 116.5 g/equivalent) are dissolved in 40 ml of N-methylpyrrolidone (NMP) and cooled to −15° C. under nitrogen in a cylindrical vessel provided with a stirrer, dropping funnel, thermometer, gas inlet tube and gas outlet tube. 5.588 g of benzophenone-4,4'-dicarboxylic acid chloride are added in solid form, with stirring. When the substance has dissolved, the cooling is removed and stirring is continued for 4.5 hours, during which the internal temperature rises gradually to room temperature. 4.0 g of triethylamine are then added dropwise in order to bond the HCl formed during the reaction. After 2 hours, the polyamide solution is poured onto 500 ml of water and the polyamide is precipitated by intense mixing in a domestic mixer. The polyamide is then filtered off, washed thoroughly with water and dried at 80° C. in vacuo. The reduced viscosity ($\eta$ red.) at 25° C., measured as a 0.5% solution in m-cresol, is 0.80 dl/g.

The glass transition temperature Tg, measured by differential scanning calorimetry (DSC) is 226° C.

Relief image production:

A polymer film about 1–2 μm thick is produced by whirler-coating a 5% polyamide solution onto a sheet of plastic laminated on one side with copper, the solvent (N-methylpyrrolidone) being removed in a circulating air oven at 80° C. The sheet thus coated is exposed to a 1,000 watt UV lamp at room temperature from a distance of 18 cm through a photomask (21 step Stouffer sensitivity guide). The sheet thus exposed is then developed with N-methylpyrrolidone (NMP), the nonexposed portions of the polymer film being dissolved away. The image is rendered visible by etching the copper layer thus revealed with FeCl$_3$ solution. A sensitivity of 6–7 is achieved with an exposure time of 240 seconds.

EXAMPLES 2–13

Polyamides are prepared in a manner similar to that in Example 1 by reacting various diamines with stoichiometric amounts of benzophenone-4,4'-dicarboxylic acid chloride in NMP. In examples 6, 7, 8, 9, 12 and 13, a corresponding amount of propylene oxide is used instead of triethylamine for bonding the HCl.

The physical data and sensitivity under the irradiation conditions described in Example 1 are summarised in Table 1.

EXAMPLE 14

1.99 g of 4,4'-diaminodiphenylmethane are dissolved in 25 ml of NMP in an apparatus as described in Example 1, and 3.145 g of benzophenone-3,4,4'-tricarboxylic acid anhydride chloride are added at −15° C., under nitrogen and with stirring. When everything has dissolved, the cooling is removed and the solution is stirred for 1.5 hours. After addition of 0.65 g of propylene oxide, stirring is continued at room temperature for 3.5 hours. 2.2 g of triethylamine and 4.6 g of acetic anhydride are then added dropwise and the solution is stirred at room temperature for 16 hours. The polyamide-imide is isolated by precipitation with water, as described in Example 1. The physical properties and the sensitivity under the irradiation conditions described in Example 1 are shown in Table 1.

EXAMPLES 15–18

Various polyamide-imides are prepared from diamines and benzophenone-3,4,4'-tricarboxylic acid anhydride chloride in a manner similar to that in Example 14, and are used for photographic relief image production. In Examples 15 and 18, triethylamine is used instead of propylene oxide for bonding the HCl. The physical properties and sensitivity under the irradiation conditions described in Example 1 are summarised in Table 1.

EXAMPLE 19

4.52 g of 2,2-dimethyl-11-amino-11-isopropylundecan-1-ol and 5.625 g of benzophenone-3,4,4'-tricarboxylic acid are mixed in a cylindrical vessel provided with a metal stirrer and a distillation attachment, and the mixture is heated to 190° C., while passing nitrogen through. The temperature is increased to 240° C. in the course of 2 hours. When the temperature has been set at 220° C., 1 g of ethylene glycol is added and the temperature is increased again slowly to 250° C. After 3 hours, 600 ppm of tetraisopropyl o-titanate are added and condensation is continued for a further 2 hours—first under a waterpump vacuum and then under a high vacuum (<1 mm Hg)—at 250° C. After cooling to room temperature, the polyester-imide is dissolved out of the vessel with NMP and isolated by precipitation in water. The properties and the sensitivity are shown in Table 1.

EXAMPLE 20

5.12 g of 3,3',5,5'-tetramethyl-4,4'-dihydroxydiphenylmethane are dissolved in a mixture of 40 ml of 1N NaOH and 300 ml of water and the solution is introduced into a domestic mixer. A solution of 6.14 g of benzophenone-4,4'-dicarboxylic acid chloride in 20 ml of chlorobenzene is poured in, with vigorous stirring, and stirring of the mixture is continued for 10 minutes. The polyester precipitated is filtered off, stirring in 500 ml of alcohol for 15 minutes, filtered off again and dried in vacuo at 80°. The physical properties and sensitivity are shown in Table 1.

EXAMPLE 21

5.7 g of butane-1,4-diol, 5.18 g of benzophenone-4,4'-dicarboxylic acid ethyl ester and 700 ppm of tetraisopropyl o-titanate are heated up to 170° C. in a cylindrical vessel provided with a stirrer and distillation attachment, while passing nitrogen through, and the mixture is kept at this temperature under normal pressure for 3 hours. When the trans-esterification has ended, a vacuum is slowly applied. When a pressure of <1 mm Hg has been reached, polycondensation is carried out for 2 hours. After cooling to room temperature, the polyester is removed mechanically from the polycondensation vessel. The properties and sensitivity are shown in Table 1.

EXAMPLE 22

3.54 g of technical grade bisphenol A bisglycidyl ether, 3.14 g of benzophenone-4,4'-dicarboxylic acid and 0.037 ml of benzyldimethylamine in 38 ml of NMP are stirred at 135° C. for 7 hours under nitrogen. After cooling, the solution is used directly for film formation on the copperlaminated sheet. For data for the relief image production, see Table 1.

EXAMPLE 23

3.59 g of benzophenone-4,4'-dicarboxylic acid ethyl ester are trans-esterified with 5.38 g of thiodiethylene glycol in a manner similar to that in Example 21 and the product is then polycondensed in vacuo. For the properties and sensitivity, see Table 1.

EXAMPLES 24–26

Various diamines are reacted with stoichiometric amounts of benzophenonedicarboxylic acid chloride in a manner similar to that in Example 1. In these cases, a mixture of NMP and methylene chloride is used as the solvent, instead of NMP. The composition, properties and sensitivity are given in Table 1.

cooling, the solution is used directly for film formation on a copper-laminated sheet. The physical data and sensitivity are shown in Table 1.

TABLE 7

| Example | Composition Component 1 | Component 2 | ηred. (dl/g) | Tg (°C.) | Exposure time (seconds) | Developer | Sensitivity (steps reproduced) |
|---|---|---|---|---|---|---|---|
| 2 | N,N'—dicyclohexyl-1,6-diaminohexane | BDCC[1] | 0.51 | 123 | 180 | NMP | 7–8 |
| 3 | DDM[2] | BDCC | 0.87 | 271 | 300 | NMP | 5 |
| 4 | m-phenylenediamine | BDCC | 0.66 | 275 | 900 | NMP/TCE[3] | 7 |
| 5 | 3,3',5,5'-tetramethyl-DDM | BDCC | 0.70 | 285 | 120 | NMP | 4–5 |
| 6 | 2,4-diaminotoluene | BDCC | 0.73 | 288 | 900 | NMP/CHCl$_3$ | 4 |
| 7 | 3,3'-dimethyl-5,5'-diethyl-DDM | BDCC | 0.85 | 273 | 120 | NMP/CHCl$_3$ | 5–6 |
| 8 | 2-amino-6-methyl-6-(3-ethyl-4-aminophenyl)-heptane | BDCC | 0.31 | 180 | 600 | NMP/CHCl$_3$ | 4 |
| 9 | m-xylylenediamine | BDCC | 0.33 | 177 | 180 | NMP/CHCl$_3$ | 3–4 |
| 10 | piperazine | BDCC | 0.41 | 256 | 180 | CHCl$_3$ | 4 |
| 11 | 2,5-dimethylpiperazine | BDCC | 0.48 | 235 | 150 | NMP | 5 |
| 12 | 3,3'-diisopropyl-DDM | BDCC | 0.64 | 204 | 180 | NMP/CHCl$_3$ | 3 |
| 13 | 1,11-diamino-1-isopropyl-10,10-dimethyl-undecane | BDCC | 0.40 | 123 | 120 | NMP | 6 |
| 14 | DDM | BTCAC[4] | 1.20 | 256 | 300 | NMP | 2–3 |
| 15 | 3,3'-dimethyl-DDM | BTCAC | 0.63 | 239 | 300 | NMP | 2–3 |
| 16 | 2,4-diaminotoluene | BTCAC | 0.81 | 296 | 600 | NMP | 6–7 |
| 17 | 3,3',5,5'-tetramethyl-DDM | BTCAC | 1.13 | 300 | 180 | NMP | 8–9 |
| 18 | 1,10-diamino-1,10-di-n-hexyldecane | BTCAC | 0.20 | 57 | 30 | NMP | 6–7 |
| 19 | 2,2-dimethyl-11-amino-11-isopropylundecan-1-ol | BTC[5] | 0.59 | 84 | 15 | NMP/CHCl$_3$ | 6–7 |
| 20 | 3,3',5,5'-tetramethyl-4,4'-dihydroxydiphenyl-methane | BDCC | 0.30 | 172 | 300 | CHCl$_3$ | 3 |
| 21 | butane-1,4-diol | BDCE[6] | 0.43 | 67 | 20 | CHCl$_3$ | 7–8 |
| 22 | bisphenol A-bisglycidyl ether | BDC[7] | n.d.[8] | n.d.[8] | 300 | NMP | 6 |
| 23 | thiodiethylene glycol | BDCE | 0.14 | n.d. | 180 | CHCl$_3$ | 5 |
| 24 | N,N'—diisopropyl-hexamethylenediamine | BDCC | 0.40 | 100 | 150 | CHCl$_3$ | 4 |
| 25 | 1,10-diamino-1,10-dimethyldecane | BDCC | 0.65 | 133 | 120 | NMP | 6–7 |
| 26 | 1,10-diamino-1,1,10,10-tetramethyldecane | BDCC | 0.40 | 113 | 120 | NMP | 5–6 |
| 27 | 4,4'-diaminodiphenyl-methane | [9] | 0.52 | 224 | 360 | NMP | 3 |
| 28 | 1,11-diamino-1-isopropyl-10,10-dimethylundecane | [9] | 0.49 | 117 | 500 | NMP | 4 |
| 29 | 3,3',5,5'-tetramethyl-4,4'-diaminodiphenyl-methane | [9] | 0.50 | 229 | 500 | NMP | 6–7 |
| 30 | bisphenol A-bisglycidyl ether | [10] | 0.15 | 95 | 120 | NMP | 2 |

[1] BDCC = benzophenone-4,4'-dicarboxylic acid dichloride
[2] DDM = 4,4'diaminodiphenylmethane
[3] TCE = 1,1,1-trichloroethane
[4] BTAC = benzophenone-3,4,4'-tricarboxylic acid anhydride chloride
[5] BTC = benzophenone-3,4,4'-tricarboxylic acid
[6] BDCE = benzophenone-4,4'-dicarboxylic acid diethyl ester
[7] BCD = benzophenone-4,4'-dicarboxylic acid
[8] n.d. = not determined
[9] (1,3-phenylenedicarbonyl)-bis-4,4'-benzoyl chloride
[10] (1,4-phenylenedicarbonyl)-bis-4,4'benzoic acid

EXAMPLES 27–29

Polyamides are prepared in a manner similar to that in Example 1 by reacting various diamines with stoichiometric amounts of (1,3-phenylenedicarbonyl)-bis-4,4'-benzoyl chloride in NMP. The physical data and sensitivity are summarised in Table 1.

EXAMPLE 30

3.57 g of technical grade bisphenol A bisglycidyl ether, 4.39 g of (1,4-phenylenedicarbonyl)-bis-4,4'-benzoic acid and 0.04 ml of benzyldimethylaniline are warmed to 130° C. in 30 ml of NMP for 8 hours. After

What is claimed is:

1. A radiation-sensitive linear saturated homopolymer or copolymer, selected from the group consisting of the polyamides and polyamide-imides, which comprises
  (a) 100 to 10 mol %, based on the total polymer, of at least one of the recurring structural units of formula I, formula II or mixtures thereof

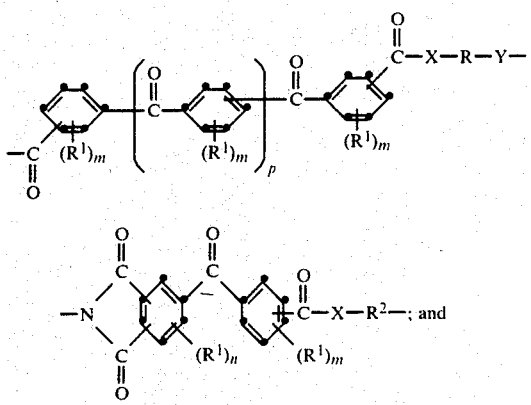

(I)

(II)

(b) 0 to 90 mol %, based on the total polymer of recurring structural units of formula III, formula IV or mixtures thereof

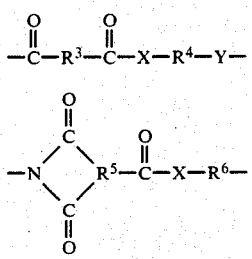

(III)

(IV)

in which the imide group in structural element II is bonded to two adjacent C atoms, m is 0 or a number from 1 to 4, p is 0 or a number from 1 to 5 and n is 0 or a number from 1 to 3, X is $-NR^7-$ and Y independently has the same meaning as X, $R^1$ is alkyl or alkoxy having less than 6 C atoms, aryl having 6 to 10 C atoms, aralkyl having 7 to 10 C atoms or halogen, R is an unsubstituted divalent aliphatic, cycloaliphatic, araliphatic or aromatic radical; or said aliphatic radical substituted by halogen, by alkyl of 1 to 6 C atoms or by alkoxy of 1 to 6 C atoms; or said cycloaliphatic radical substituted by alkyl of 1 to 4 C atoms, or said araliphatic radical substituted on the aryl by alkyl of 1 to 6 C atoms; or said aromatic radical substituted by alkoxyalkyl, alkoxy, by alkyl of 1 to 6 C atoms, by trimethylene or tetramethylene; or R and one of the radicals $R^7$ together are alkylene having 5 to 7 C atoms, to which the second $-NR^7-$ group is bonded, or R is methylene, ethylene or propylene and the two radicals $R^7$ of the $NR^7$ groups together are ethylene or propylene, $R^2$ is an unsubstituted divalent aliphatic or aromatic hydrocarbon radical; or said aliphatic radical substituted by halogen, by alkyl of 1 to 6 C atoms or by alkoxy of 1 to 6 C atoms; or said aromatic radical substituted by alkoxyalkyl, by alkoxy, by alkyl of 1 to 6 carbon atoms, by trimethylene or by tetramethylene; or $R^2$ and $R^7$ together are alkylene having 5 to 7 C atoms, $R^4$ independently has the same meaning as R, and $R^6$ independently has the same meaning as $R^2$, $R^3$ is a divalent saturated aliphatic or aromatic radical, $R^5$ is a trivalent saturated aliphatic or aromatic radical in which the imide group is bonded to two adjacent C atoms and $R^7$ is a hydrogen atom, alkyl, cycloalkyl, aryl, aralkyl or alkaralkyl.

2. A polymer according to claim 1 in which R, $R^2$, $R^4$ and $R^6$ independently of one another are, as an aliphatic radical, linear or branched alkylene which can be interrupted by oxygen atoms, NH, $NR^a$ or $+NR''_2G^\ominus$, in which $R^a$ is alkyl having 1 to 12 C atoms or cycloalkyl having 5 or 6 ring C atoms, phenyl or benzyl and $G^\ominus$ is the anion of a proton acid, or cyclohexylene, naphthylene, phenylene or a hydantoin; or, as a cycloaliphatic radical, monocyclic or bicyclic cycloalkylene which has 5 to 7 ring C atoms; or said cycloalkylene substituted by alkyl; or, as an araliphatic radical, aralkylene or said aralkylene substituted on the aryl by alkyl, it being possible for the alkylene to be linear or branched; or as an aromatic radical, are a hydrocarbon radical or pyridine radical or said radicals substituted by alkyl, alkoxy, alkoxyalkyl, trimethylene or tetramethylene.

3. A polymer according to claim 1 in which X and Y in formulae I to IV are the $-NR^7-$ group and R, $R^2$, $R^4$ and $R^6$ are an aromatic radical

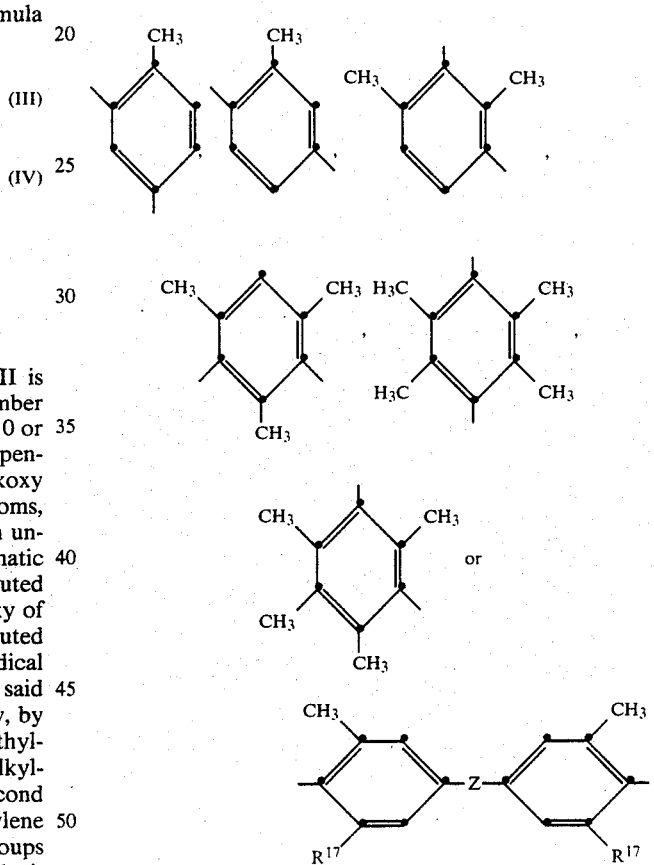

in which Z is a direct bond, O or $CH_2$, and $R^{17}$ is methyl or ethyl, or branched alkylene having 6 to 20 C atoms, which is branched in the α-position relative to the $-NR^7-$ group.

4. A polymer according to claim 1, which contains at least 50 mol %, of structural elements of the formula I—II.

5. A polymer according to claim 1, in which p, m and n in the structural elements of the formulae I and II are 1 or, in particular, 0.

6. A polymer according to claim 1, in which $R^1$ is methyl, ethyl, methoxy, Br or Cl.

7. A polymer according to claim 1, in which $R^7$ is alkyl having 1 to 6 C atoms, cycloalkyl having 5 or 6 ring carbon atoms, phenyl, benzyl or, a hydrogen atom.

8. A polymer according to claim 1, in which the carbonyl groups in the structural elements of the formulae I and II are bonded in the meta-position or, in the para-position relative to the carbonyl bridge group and the imide group in the structural element of the formula II is bonded in the ortho-/meta-position, in the meta-/para-position, relative to the carbonyl bridge group.

9. A polymer according to claim 1, in which R, $R^2$, $R^4$ and $R^6$ contain 2 to 30 C atoms as an aliphatic radical, 5 to 8 ring C atoms as a cycloaliphatic radical, 7 to 30 C atoms as an araliphatic radical and 6 to 30 C atoms as an aromatic radical.

10. A polymer according to claim 1, in which X and Y in formulae I to IV are the group —$NR^7$— and the aliphatic or araliphatic radical contains 6 to 22 C atoms.

11. A polymer according to claim 2, in which R, $R^2$, $R^4$ and $R^6$, as an aliphatic radical, are linear or branched alkylene having 2 to 30 C atoms, —$(CH_2)_x$—$R^8$—$(CH_2)_y$—, in which $R^8$ is phenylene, naphthylene, cyclopentylene or cyclohexylene and x and y independently of one another are the number 1, 2 or 3, —$R^9$—$(OR^{10})_pO$—$R^9$—, in which $R^9$ is ethylene, 1,2-propylene, 1,3-propylene or 2-methyl-1,3-propylene and $R^{10}$ is ethylene, 1,2-propylene, 1,2-butylene, 1,3-propylene or 1,4-butylene and p is a number from 1 to 100, or

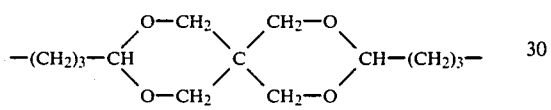

12. A polymer according to claim 2, in which R, $R^2$, $R^4$ and $R^6$, as a cycloaliphatic radical, are one of the formulae

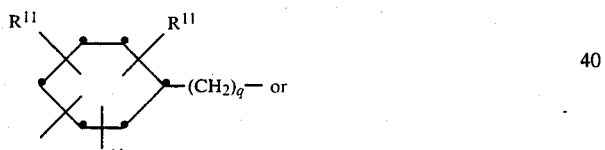

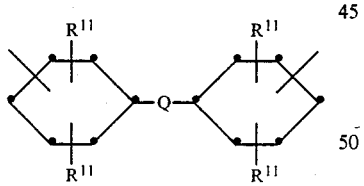

in which q is 0 or 1, the radicals $R^{11}$ independently are hydrogen or alkyl having 1 to 6 C atoms and Q is a direct bond, O, S, $SO_2$, alkylene having 1 to 3 C atoms or alkylidene having 2 to 6 C atoms.

13. A polymer according to claim 2, in which R, $R^2$, $R^4$ and $R^6$, as an aromatic radical, are substituted by alkyl, alkoxy or alkoxyalkyl having 1 to 6 C atoms, or two adjacent C atoms of the aromatic radical are substituted by trimethylene or tetramethylene.

14. A polymer according to claim 13, in which X and Y in the formulae I to IV are the group —$NR^7$— and one or two substituents are bonded in the ortho-position relative to the —$NR^7$— group.

15. A polymer according to claim 2, in which the araliphatic radical has the formula

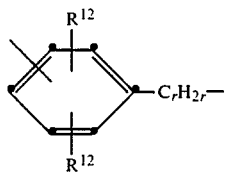

in which the radicals $R^{12}$ independently of one another are hydrogen atoms or alkyl having 1 to 6 C atoms and r is an integer from 1 to 16.

16. A polymer according to claim 15, in which the free bond is in the p-position relative to the $C_rH_{2r}$-group and one or both of the radicals $R^{12}$, as alkyl, are bonded in the o-position relative to the free bond.

17. A polymer according to claim 2, in which the aromatic radical has the formula

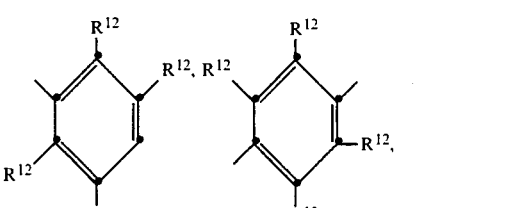

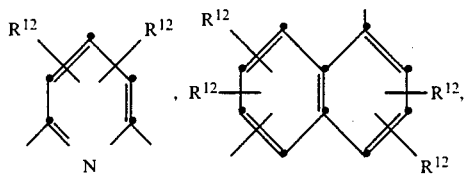

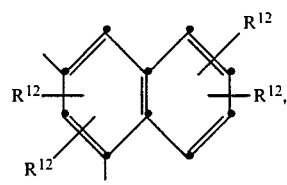

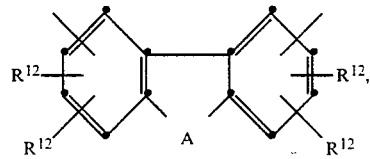

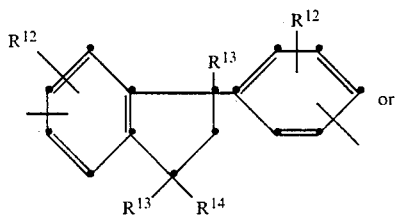

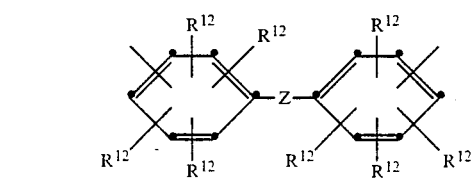

in which the radicals $R^{12}$ are hydrogen atoms or, in the case of monosubstitution, one radical $R^{12}$ is alkyl having 1 to 6 C atoms and the other radicals $R^{12}$ are hydrogen atoms, or, in the case of di-, tri- or tetra-substitution, two of the radicals $R^{12}$ are alkyl having 1 to 6 C atoms and the other radicals $R^{12}$ are hydrogen atoms or alkyl having 1 to 6 C atoms, or, in the case of di-, tri- or tetra-substitution, two vicinal radicals $R^{12}$ in the phenyl ring are trimethylene or tetramethylene and the other radicals $R^{12}$ are hydrogen atoms or alkyl having 1 to 6 C atoms, A is O, S, NH, CO or $CH_2$, $R^{13}$ is a hydrogen atom or alkyl having 1 to 5 C atoms and $R^{14}$ is alkyl having in each case 1 to 5 C atoms, and Z is a direct bond, O, S, SO, $SO_2$, CO,

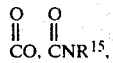

$NR^{15}$, CONH, NH, $R^{15}SiR^{16}$, $R^{15}OSiR^{16}$, alkylene having 1 to 6 C atoms, alkenylene or alkylidene having 2 to 6 C atoms, phenylene or phenyldioxyl, in which $R^{15}$ and $R^{16}$ independently of one another are alkyl having 1 to 6 C atoms or phenyl.

18. A polymer according to claim 17, in which the aromatic radical is

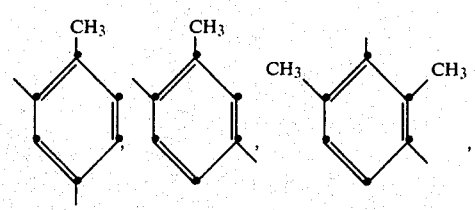

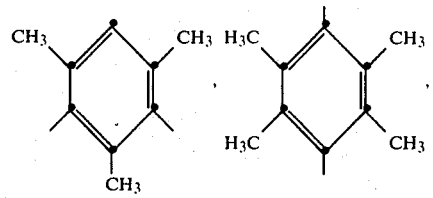

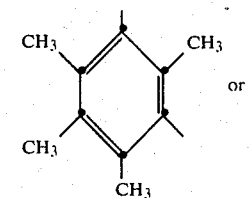

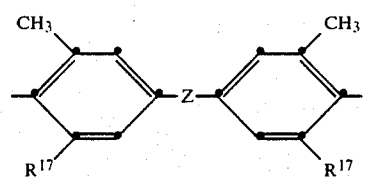

in which Z is a direct bond, O or, $CH_2$ and $R^{17}$ is a hydrogen atom, methyl or ethyl.

19. A polymer according to claim 1, in which $R^3$ in formula III is linear or branched alkylene having 2 to 12 C atoms, cycloalkylene with 5 to 7 ring carbon atoms or an aromatic hydrocarbon radical having 6 to 18 C atoms.

20. A polymer according to claim 1, in which $R^5$ in formula IV is phen-1,2,4-triyl.

21. A polymer according to claim 1, which contains the structural elements

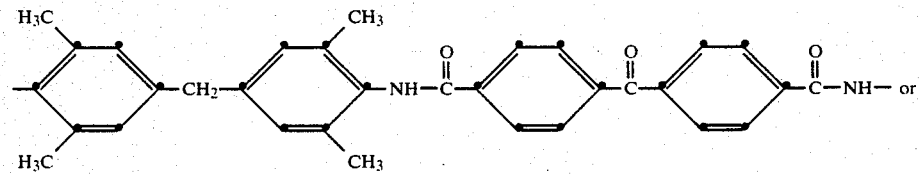

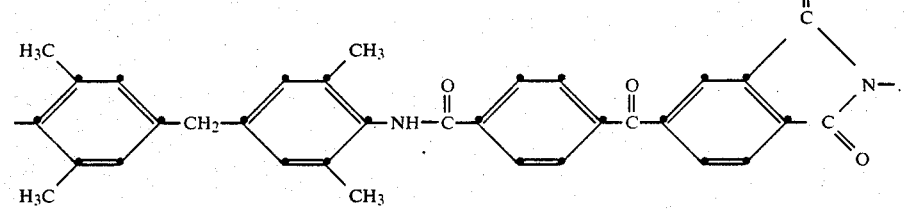

22. A coated material containing a layer of a polymer according to claim 1 on a carrier.

* * * * *